(12) United States Patent
Chen et al.

(10) Patent No.: US 10,170,397 B2
(45) Date of Patent: Jan. 1, 2019

(54) SEMICONDUCTOR DEVICES, VIA STRUCTURES AND METHODS FOR FORMING THE SAME

(71) Applicant: Vanguard International Semiconductor Corporation, Hsinchu (TW)

(72) Inventors: Li-Che Chen, Hsinchu (TW); Francois Hebert, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/204,281

(22) Filed: Jul. 7, 2016

(65) Prior Publication Data

US 2018/0012823 A1 Jan. 11, 2018

(51) Int. Cl.
*H01L 23/48* (2006.01)
*H01L 21/768* (2006.01)

(52) U.S. Cl.
CPC ...... *H01L 23/481* (2013.01); *H01L 21/76898* (2013.01)

(58) Field of Classification Search
CPC .......... H01L 23/481; H01L 21/76898
See application file for complete search history.

(56) References Cited

U.S. PATENT DOCUMENTS

2009/0267183 A1* 10/2009 Temple ............ H01L 21/76898
257/532

FOREIGN PATENT DOCUMENTS

| TW | 201431019 A | 8/2014 |
|----|-------------|--------|
| TW | 201603153 A | 1/2016 |

* cited by examiner

*Primary Examiner* — Fei Fei Yeung Lopez
(74) *Attorney, Agent, or Firm* — Birch, Stewart, Kolasch & Birch, LLP

(57) ABSTRACT

A semiconductor device includes a via structure penetrating through a substrate, a top metal layer and an electronic component over the via structure, and a bottom metal layer and another electronic component below the via structure. The via structure includes a through hole penetrating from a first surface to an opposite second surface of a substrate, a filling insulating layer within the through hole, a first conductive layer, which is within the through hole and surrounds the filling insulating layer, wherein a portion of the first conductive layer is below the filling insulating layer and at the bottom of the through hole. The via structure further includes a first insulating layer, which is on the sidewalls of the through hole and surrounds the first conductive layer.

10 Claims, 13 Drawing Sheets

SEMICONDUCTOR DEVICES, VIA STRUCTURES AND METHODS FOR FORMING THE SAME

BACKGROUND OF THE INVENTION

Field of the Invention

The invention relates to semiconductor devices, and in particular to via structures of semiconductor devices and methods for forming the same.

Description of the Related Art

In traditional two-dimensional (2D) manufacturing processes, metal wires are routed through various structural layers in order to connect two devices. This can induce signal decay and increase costs. Therefore, to overcome these problems, three-dimensional (3D) integrated circuit (IC) semiconductor technology has been developed, wherein one of the key technologies is the through silicon via (TSV). By using through silicon via technology to replace traditional long-distance metal wires, the stacked chips are conducted vertically, and the ways in which the signals are transmitted have been changed from horizontally to vertically. As a result, the chip stacking density can be increased, the volume of the devices can be decreased, power consumption can be decreased, signal transmission speeds can be improved, and last but not least, the product efficiency can be increased. The through silicon via technology is widely applied in several areas.

Although existing via structures of semiconductor devices and methods for forming the same have been adequate for their intended purposes, they have not been entirely satisfactory in all respects. Therefore, up to the present, there are still some problems that can be improved in via structures of semiconductor devices and technology.

BRIEF SUMMARY OF THE INVENTION

Embodiments of via structures of semiconductor devices and methods for forming the same are provided. The differences in mechanical properties and coefficients of thermal expansion between different filling materials in the via structures are the main cause of unevenly distributed stress, which may easily produce cracks inside the devices. To overcome the foregoing problems, several sandwich structures including an insulating layer, a conductive layer, and an insulating layer are utilized in the embodiments.

Some embodiments of the disclosure provide a via structure of a semiconductor device. The via structure of the semiconductor device includes a through hole penetrating from a first surface to an opposite second surface of a substrate. The via structure also includes a filling insulating layer disposed in the through hole. The via structure further includes a first conductive layer disposed in the through hole and surrounding the filling insulating layer, wherein a portion of the first conductive layer is located below the filling insulating layer and at a bottom of the through hole. In addition, the via structure includes a first insulating layer disposed on sidewalls of the through hole and surrounding the first conductive layer.

Some embodiments of the disclosure provide a semiconductor device. The semiconductor device includes a through hole penetrating from a first surface to an opposite second surface of a substrate. The semiconductor device also includes a filling insulating layer disposed in the through hole. The semiconductor device further includes a first conductive layer disposed in the through hole and surrounding the filling insulating layer, wherein a portion of the first conductive layer is located below the filling insulating layer and at a bottom of the through hole. In addition, the semiconductor device further includes a first insulating layer disposed on sidewalls of the through hole and surrounding the first conductive layer. The semiconductor device also includes a bottom metal layer adjoining the bottom of the through hole and electrically connected to an electrical component, wherein the portion of the first conductive layer located at the bottom of the through hole is electrically connected to the bottom metal layer. The semiconductor device further includes a top metal layer adjoining the top of the through hole and electrically connected to another electrical component.

Some embodiments of the disclosure provide a method for forming a via structure of a semiconductor device. The method includes forming a hole in a substrate and forming a filling insulating layer in the hole. The method also includes forming a first conductive layer in the hole and surrounding the filling insulating layer, wherein a portion of the first conductive layer is formed below the filling insulating layer and at a bottom of the hole. The method further includes forming a first insulating layer in the hole and surrounding the first conductive layer. In addition, the method includes performing a planarization process on a top surface of the substrate to remove the filling insulating layer, the first conductive layer and the first insulating layer outside of the hole. The method also includes performing a bottom grinding process on the bottom surface of the substrate to remove a portion of the substrate and a portion of the first insulating layer located at the bottom of the hole.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1B:
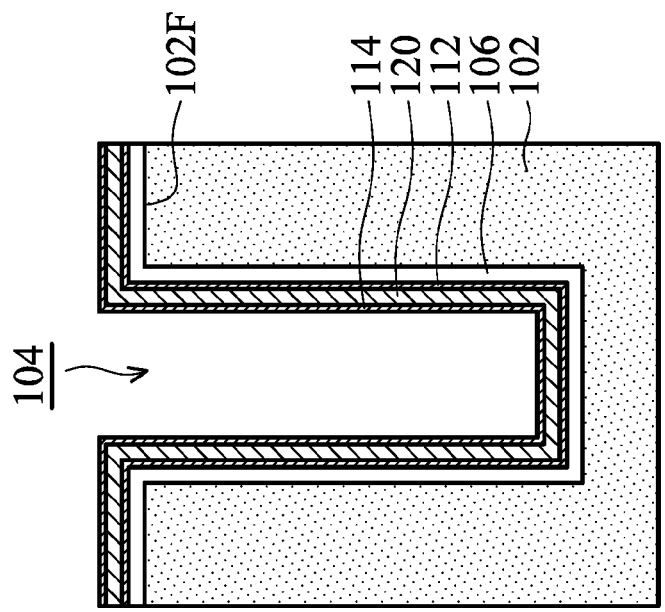
FIGS. 1A to 1G are cross-sectional views illustrating an exemplary sequential forming process of a via structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described below. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a via structure of a semiconductor device are provided. FIGS. 1A to 1G are cross-sectional views illustrating an exemplary sequential forming process of a via structure 100a in accordance with some embodiments.

Figure 1A:
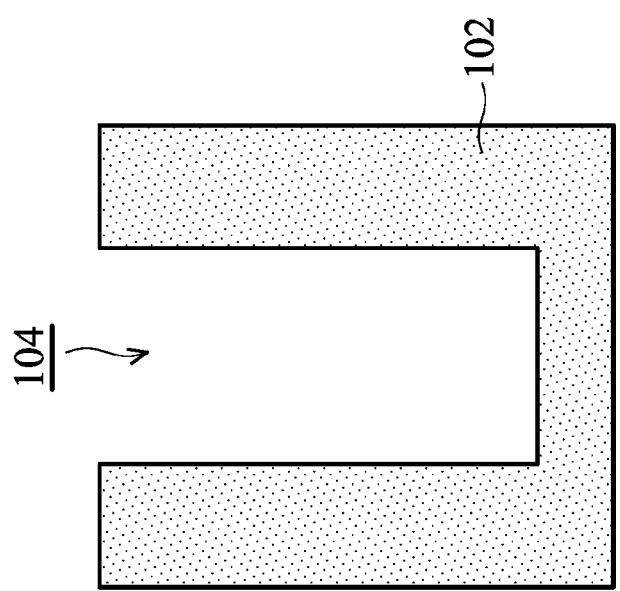

As shown in FIG. 1A, a hole 104 is formed in a substrate 102, in accordance with some embodiments. The substrate 102 may be made of silicon or other semiconductor materials. Alternatively, the substrate 102 may include other elementary semiconductor materials such as germanium. In some embodiments, the substrate 102 is made of a compound semiconductor such as silicon carbide, gallium nitride, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

In some embodiments, the hole 104 is formed by applicable processes, for example, photolithography and etching processes.

As shown in FIG. 1B, a first insulating layer 106, a barrier layer 112, a first conductive layer 120 and a barrier layer 114 are formed sequentially on sidewall and bottom of the hole 104 and on a top surface 102F of the substrate 102, in accordance with some embodiments. In some embodiments, the first insulating layer 106, the barrier layer 112, the first conductive layer 120 and the barrier layer 114 are deposited by using a chemical vapor deposition (CVD) process, a flowable chemical vapor deposition (FCVD) process, an atomic layer deposition (ALD) process, a low-pressure chemical vapor deposition (LPCVD) process, a plasma enhanced chemical vapor deposition (PECVD) process, another applicable process, or a combination thereof.

In some embodiments, the first insulating layer 106 includes dielectric materials, such as silicon oxide, silicon oxynitride, silicon nitride, or a combination thereof. The formation of the barrier layer 112 prevents the reactions between the gases needed for the deposition of the conductive layers and the materials of the insulating layers. In some embodiments, the barrier layers 112 and 114 are made of titanium (Ti) or titanium nitride (TiN) in order to increase the adhesion between the barrier layers 112, 114 and the insulating layers. In some embodiments, the first conductive layer 120 includes metal or other applicable conductive materials, such as tungsten (W), copper (Cu), nickel (Ni), aluminum (Al), tungsten silicide ($WSi_x$), polysilicon, or a combination thereof.

Figure 1C:
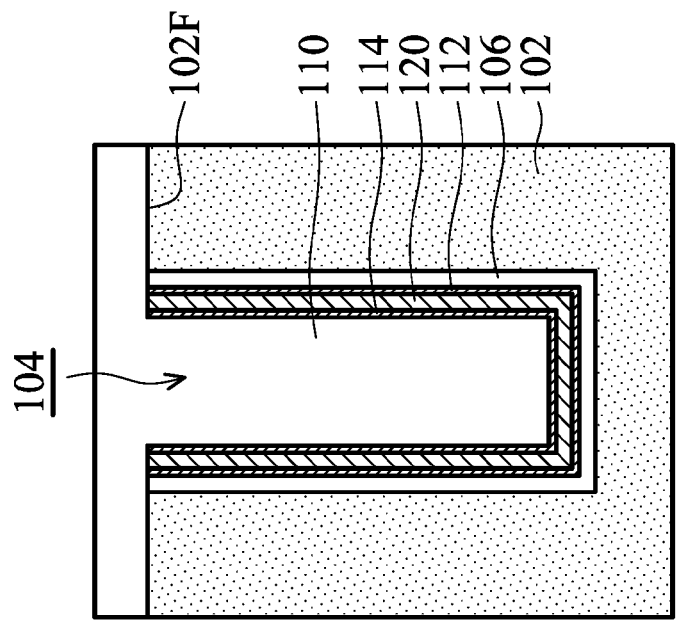

As shown in FIG. 1C, a planarization process is performed on the top surface 102F of the substrate 102 to remove the first insulating layer 106, the barrier layers 112, 114 and the first conductive layer 120 outside of the hole 104, so that the top surface 102F of the substrate 102 is exposed, in accordance with some embodiments. The planarization process includes a chemical mechanical polishing (CMP) process, a grinding process, an etching process, another applicable process, or a combination thereof. In some embodiments, the step of performing the planarization process described above may be omitted since the layers outside of the hole 104 may be removed together by one planarization process after filling the hole 104 to expose the top surface 102F of the substrate 102.

Figure 1D:
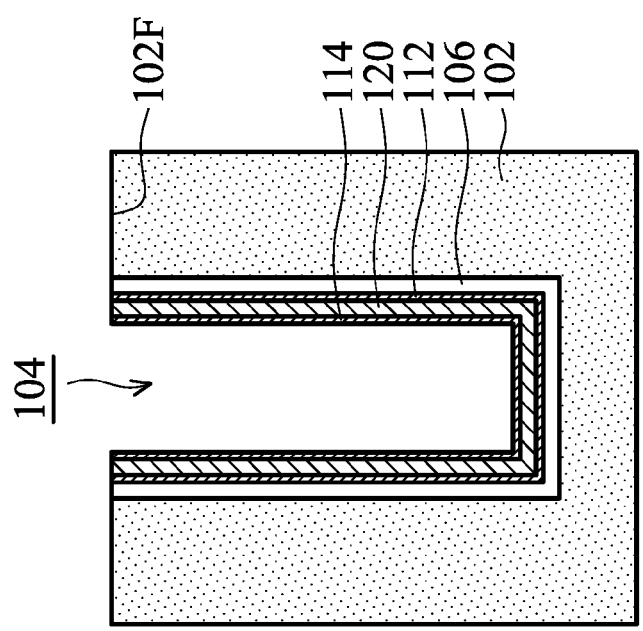

As shown in FIG. 1D, a filling insulating layer 110 is formed in the hole 104, in accordance with some embodiments. The filling insulating layer 110 includes dielectric materials, such as silicon oxide, silicon oxynitride, silicon nitride or a combination thereof. In some embodiments, the filling insulating layer 110 is deposited by using a chemical vapor deposition process, an atmospheric pressure chemical vapor deposition (APCVD) process, another applicable process or a combination thereof. It is worth noting that the top of voids inside the filling insulating layer 110 is lower than the top surface 102F of the substrate 102.

Figure 1F:
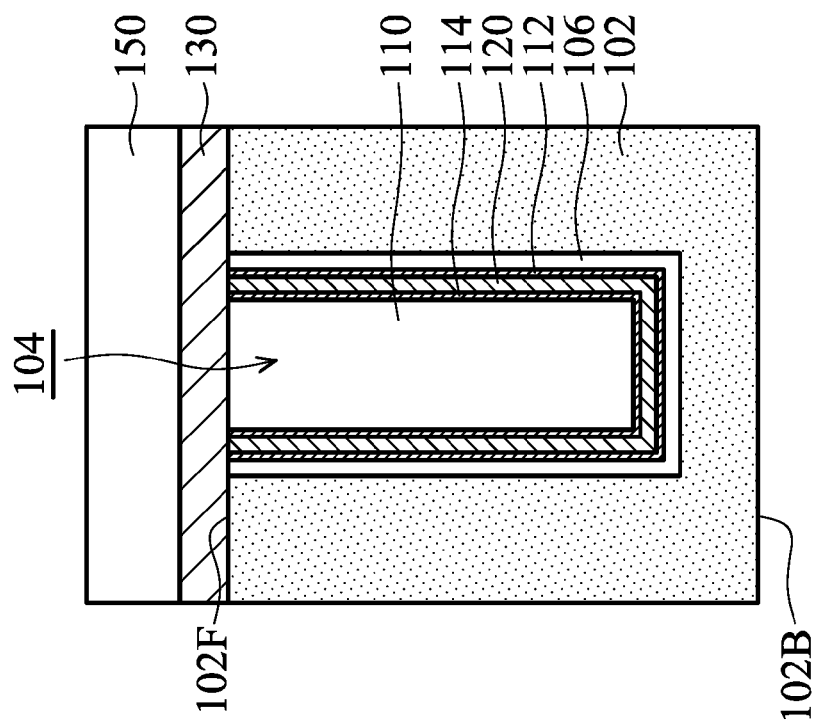
Figure 1E:
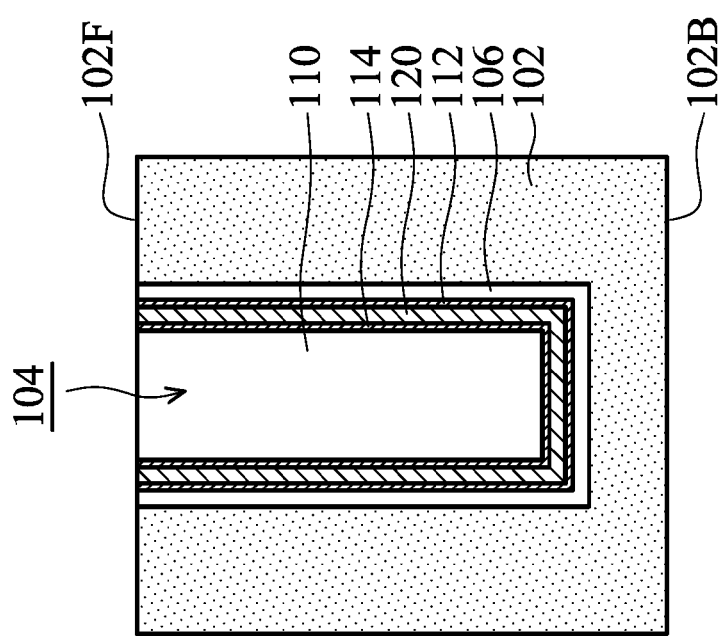

As shown in FIG. 1E, another planarization process is performed on the top surface 102F of the substrate 102 to remove the filling insulating layer 110 outside of the hole 104, so that the first conductive layer 120 and the top surface 102F of the substrate 102 are exposed, in accordance with some embodiments. The planarization process includes a chemical mechanical polishing (CMP) process, a grinding process, an etching process, another applicable process, or a combination thereof.

As shown in FIG. 1F, a top metal layer 130 is formed on the top surface 102F of the substrate 102, and an electrical component 150 is formed on the top metal layer 130, in accordance with some embodiments. In some embodiments, the electrical component 150 may include a single layer or multiple layers of conductive layers and a single layer or multiple layers of dielectric layers.

Figure 1H:
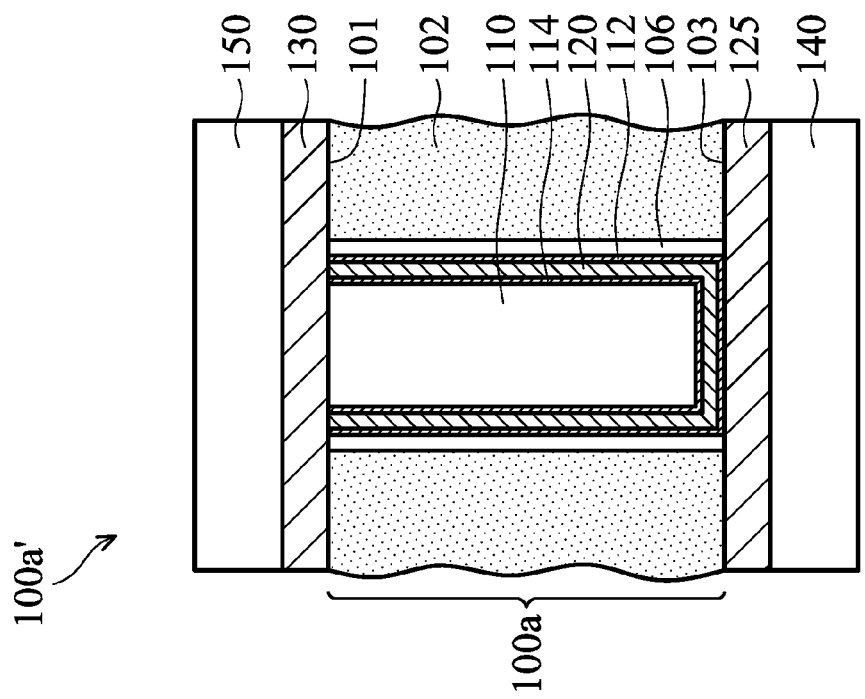
FIG. 1H is a cross-sectional view of a semiconductor device in accordance with some embodiments.
Figure 1G:
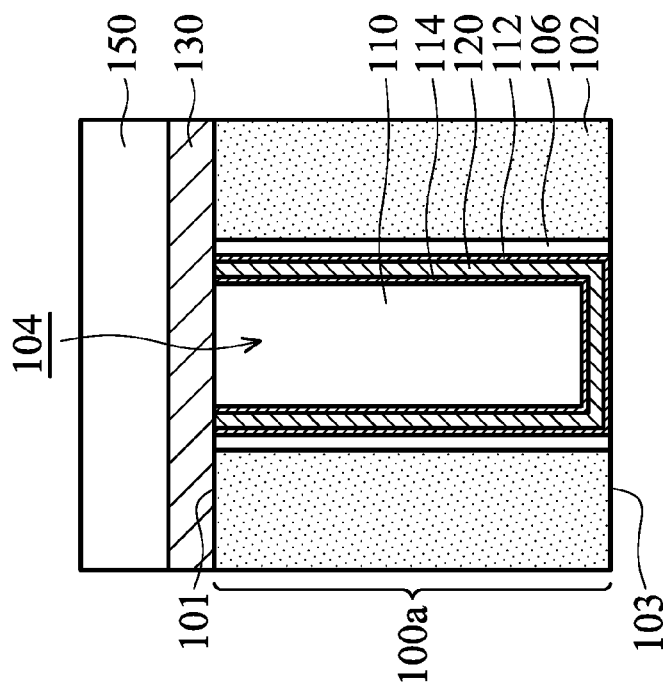

As shown in FIG. 1G, a planarization process (also called a bottom grinding process) is performed on the bottom surface 102B of the substrate 102 to remove a portion of the substrate 102 and a portion of the first insulating layer 106 located at the bottom of the hole 104, so that the barrier layer 112 is exposed (as shown in FIG. 1G) or the first conductive layer 120 is exposed (not shown), in accordance with some embodiments. In addition, the top surface 102F of the substrate 102 is regarded as a first surface 101 of the via structure 100a, the bottom surface 102B of the substrate 102 is regarded as a second surface 103 of the via structure 100a, and the via structure 100a is formed from the portion between the first surface 101 and the second surface 103. In some embodiments, the planarization process includes a chemical mechanical polishing (CMP) process, a grinding process, an etching process, another applicable process or a combination thereof. The via structure 100a includes the through hole 104, which penetrates the substrate 102 from the first surface 101 to the opposite second surface 103. The via structure 100a includes the filling insulating layer 110 disposed in the through hole 104. The via structure 100a also includes the first conductive layer 120 disposed in the through hole 104 and surrounding the filling insulating layer 110, wherein a portion of the first conductive layer 120 is located below the filling insulating layer 110 and at the bottom of the through hole 104. The via structure 100a further includes the first insulating layer 106 disposed on the sidewall of the through hole 104 and surrounding the first conductive layer 120.

Furthermore, FIG. 1H is a cross-sectional view of a semiconductor device 100a' in accordance with some embodiments. A bottom metal layer 125 is formed on the second surface 103 which is opposite to the first surface 101 of the via structure 100a, and another electrical component 140 is formed on the lower surface of the bottom metal layer 125. In some embodiments, the electrical component 140 may include a single layer or multiple layers of conductive layers and a single layer or multiple layers of dielectric layers. In some embodiments, the via structure 100a is electrically connected to the electrical component 140 below through the bottom metal layer 125 and the via structure 100a is electrically connected to another electrical component 150 above through the top metal layer 130, so as to form the semiconductor device 100a'. In some embodiments, the materials of the bottom metal layer 125 and the top metal layer 130 may be CrAu, TiAu, TiNiAu, TiNiAg or a combination thereof. The bottom metal layer 125 and the top metal layer 130 are formed by plating, chemical vapor deposition, physical vapor deposition (PVD), another applicable process, or a combination thereof. In some embodiments, the electrical components 140 may be a portion of a chip, and the electrical components 150 may be a portion of another chip. In other embodiments, the electrical components 140 may be electrically connected to a portion of an integrated circuit, and the electrical components 150 may be electrically connected to a portion of another integrated circuit.

FIGS. 2A to 2F (including FIGS. 2F-1 and 2F-2) are cross-sectional views illustrating exemplary sequential forming processes of via structures 100b and 100c in accordance with some embodiments. Both of the via structures 100b and 100c have more conductive layers, insulating layers and barrier layers than the via structure 100a shown in FIG. 1G. Some processes and materials used to form the via structures 100b and 100c are similar to, or the same as, those used to form the via structure 100a and are not repeated herein.

Figure 2B:
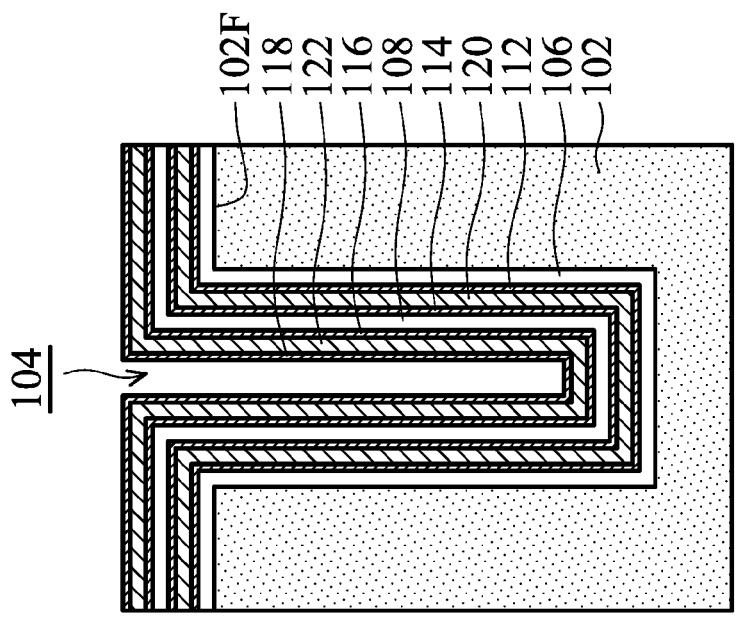
FIGS. 2A to 2F (including FIGS. 2F-1 and 2F-2) are cross-sectional views illustrating exemplary sequential forming processes of via structures in accordance with some embodiments.
Figure 2A:
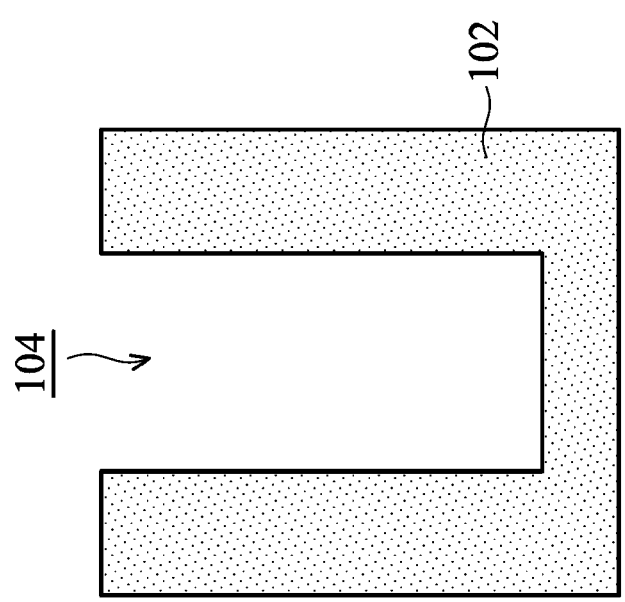

As shown in FIG. 2A, a hole 104 is formed in a substrate 102 by photolithography and etching processes, in accordance with some embodiments.

Then, as shown in FIG. 2B, a first insulating layer 106, a barrier layer 112, a first conductive layer 120, a barrier layer 114, a second insulating layer 108, a barrier layer 116, a second conductive layer 122 and a barrier layer 118 are formed sequentially on the sidewall and bottom of the hole 104 and on the top surface 102F of the substrate 102. The sequence of forming the first conductive layer 120 and the second conductive layer 122 are flexible. In some embodiments, the first conductive layer 120 is formed in a front-end-of-line (FEOL) process, and the second conductive layer 122 is formed in a back-end-of-line (BEOL) process. In some embodiments, the first conductive layer 120 and the second conductive layer 122 are formed together in a front-end-of-line or a back-end-of-line process. Therefore, based on the process requirements, the materials of the first conductive layer 120 and the second conductive layer 122 may be selected from conductive materials which have different properties, for example, thermal resistance.

Figure 2C:
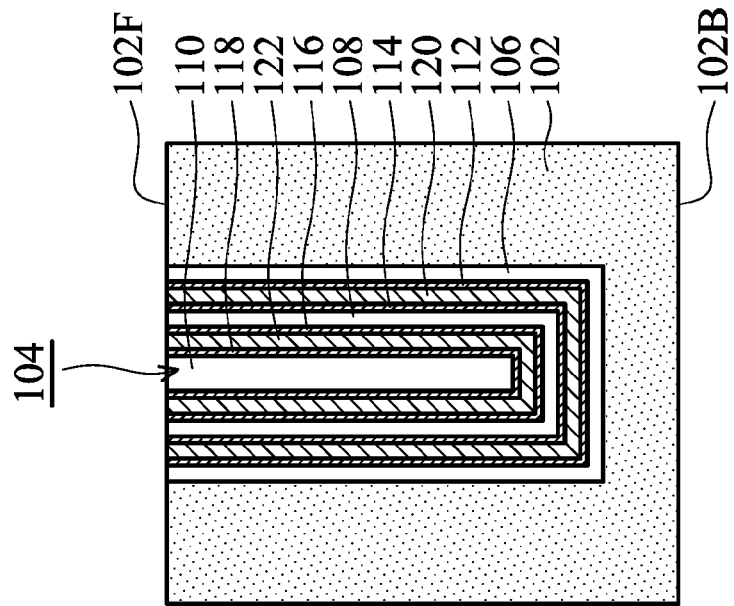

As shown in FIG. 2C, a filling insulating layer 110 is formed in the hole 104, in accordance with some embodiments. It is worth noting that, in some embodiments, a planarization process to the top surface 102F of the substrate 102 may be performed before forming the filling insulating layer 110. The foregoing planarization process is performed to remove the first insulating layer 106, the first conductive layer 120, the second insulating layer 108, the second conductive layer 122 and the barrier layers 112, 114, 116 and 118 outside of the hole 104, so as to expose the top surface 102F of the substrate 102 and then the filling insulating layer 110 is formed.

Figure 2D:
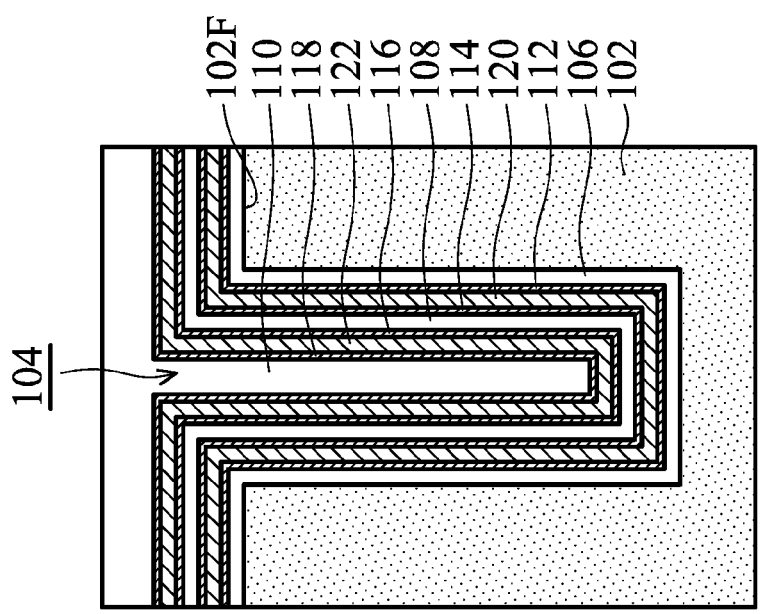

As shown in FIG. 2D, after forming the filling insulating layer 110, a planarization process is performed on the top surface 102F of the substrate 102 to remove the first insulating layer 106, the first conductive layer 120, the second insulating layer 108, the second conductive layer 122, the filling insulating layer 110 and the barrier layers 112, 114, 116 and 118 outside of the hole 104, so that the top surface 102F of the substrate 102 is exposed, and the first insulating layer 106, the first conductive layer 120, the second insulating layer 108, the second conductive layer 122, the filling insulating layer 110 and the barrier layers 112, 114, 116 and 118 inside of the hole 104 are leveled with the top surface 102F of the substrate 102, in accordance with some embodiments.

Figure 2E:
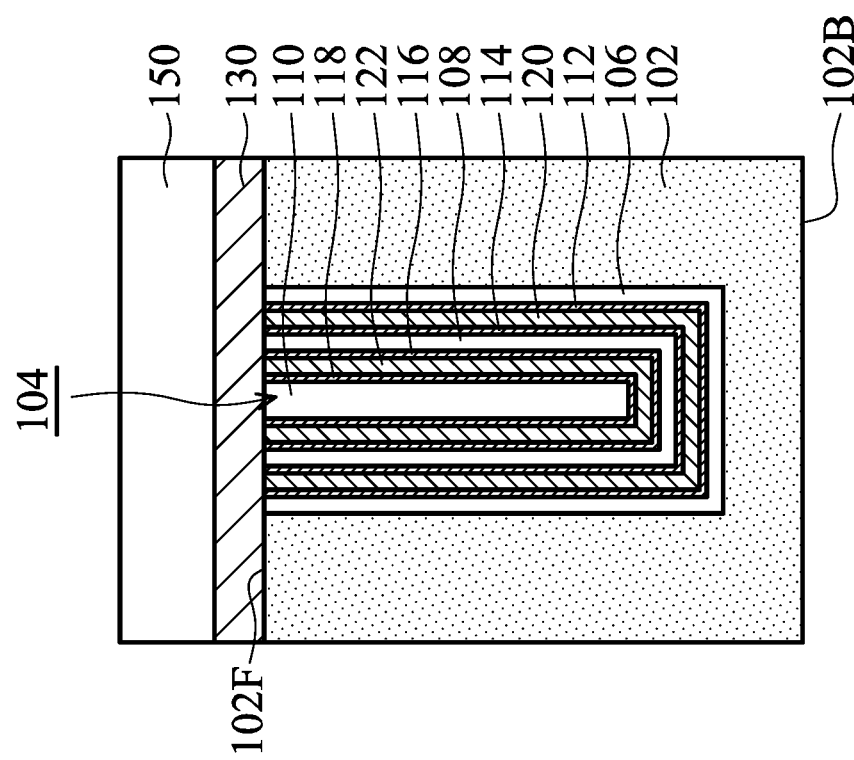

As shown in FIG. 2E, the top metal layer 130 is formed on the top surface 102F of the substrate 102, and the electrical component 150 is formed on the top metal layer 130, in accordance with some embodiments. In some embodiments, the electrical component 150 may include a single layer or multiple layers of conductive layers and a single layer or multiple layers of dielectric layers.

Figures 1, 2F:
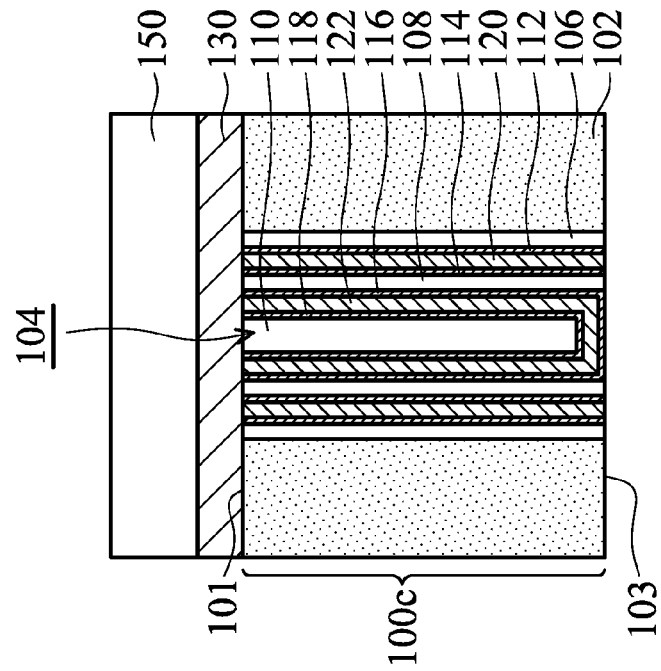
FIGS. 2G-1 and 2G-2 are cross-sectional views of semiconductor devices in accordance with some embodiments.

Continued from FIG. 2E, as shown in FIG. 2F-1, a planarization process (also called a bottom grinding process) is performed on the bottom surface 102B of the substrate 102 to remove a portion of the substrate 102 and a portion of the first insulating layer 106 located at the bottom of the hole 104, so that the barrier layer 112 is exposed (as shown in FIG. 2F-1) or the first conductive layer 120 is exposed (not shown), in accordance with some embodiments. In addition, the top surface 102F of the substrate 102 is regarded as a first surface 101 of the via structure 100b, the bottom surface 102B of the substrate 102 is regarded as a second surface 103 of the via structure 100b, and the via structure 100b is formed from the portion between the first surface 101 and the second surface 103. In comparison with the via structure 100a, the via structure 100b further includes a second conductive layer 122 disposed between the filling insulating layer 110 and the first conductive layer 120, and a portion of the second conductive layer 122 is located below the filling insulating layer 110. Moreover, compared with the via structure 100a, the via structure 100b further includes a second insulating layer 108 disposed between the first conductive layer 120 and the second conductive layer 122, and a portion of the second insulating layer 108 is located below the second conductive layer 122.

Figures 2, 2F:
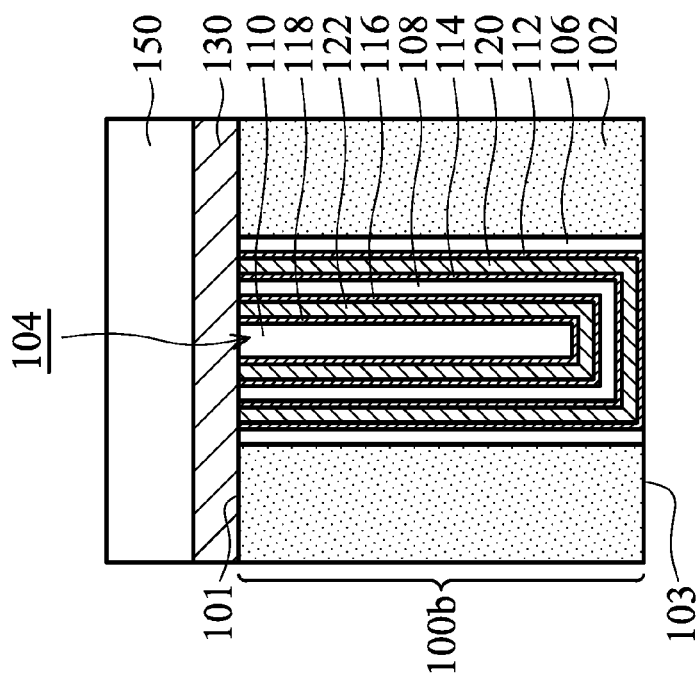

Continued from FIG. 2E, as shown in FIG. 2F-2, after performing the planarization process on the top surface 102F of the substrate 102, another planarization process (also called a bottom grinding process) is performed on the bottom surface 102B of the substrate 102 to remove a portion of the substrate 102, a portion of the first insulating layer 106, a portion of the first conductive layer 120 and a portion of the second insulating layer 108 located at the bottom of the hole 104 until the barrier layer 116 is exposed (as shown in FIG. 2F-2) or the second conductive layer 122 is exposed (not shown), in accordance with some other embodiments. In addition, the top surface 102F of the substrate 102 is regarded as a first surface 101 of the via structure 100c, the bottom surface 102B of the substrate 102 is regarded as a second surface 103 of the via structure 100c, and the via structure 100c is formed from the portion between the first surface 101 and the second surface 103. In comparison with the via structure 100b, the via structure 100c is further ground to the inside of the hole 104 until the barrier layer 116 or the second conductive layer 122 is exposed. The distance between the first surface 101 and the second surface 103 of the via structure 100c is shorter than that of the via structure 100b.

Figures 2, 2G:
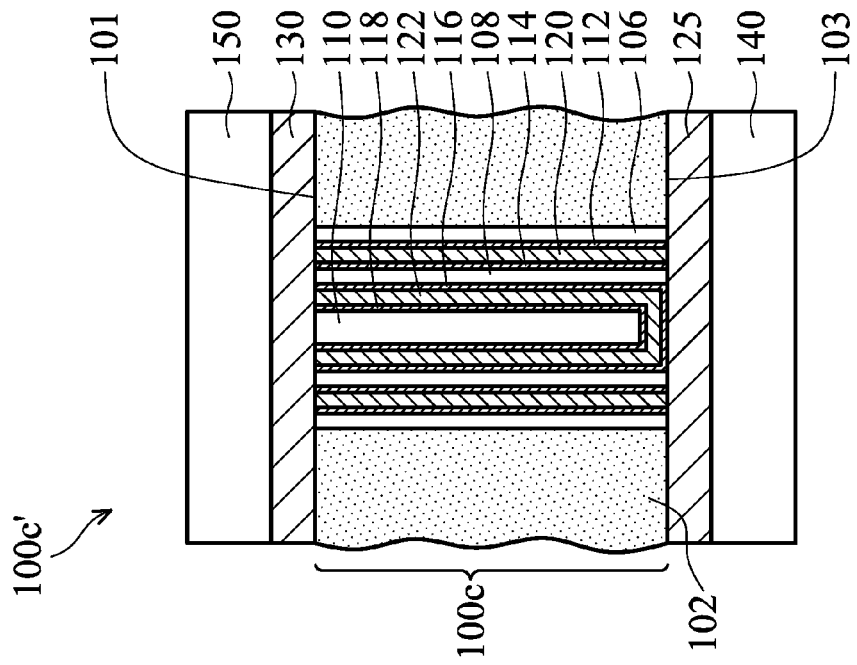
Figures 1, 2G:
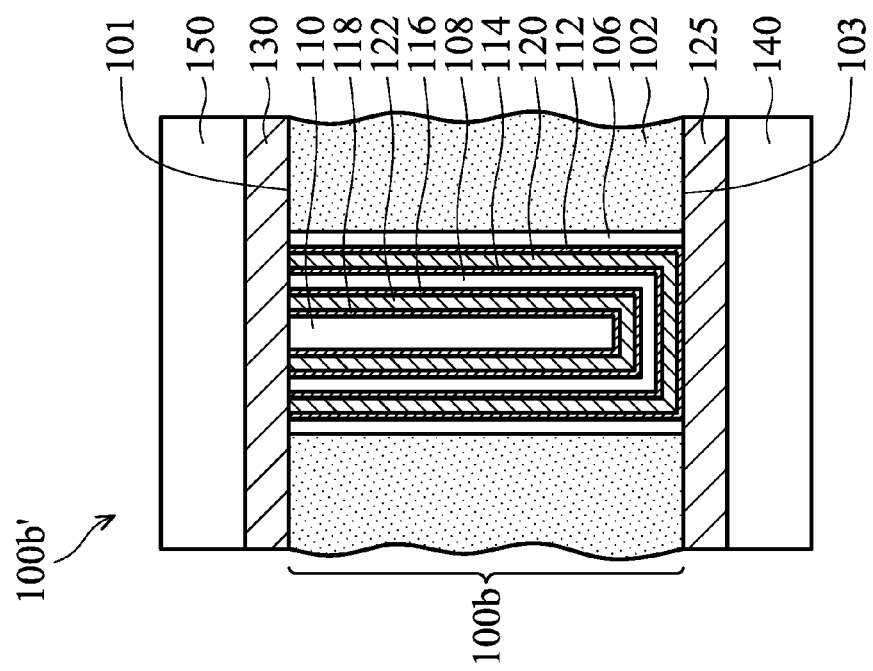

FIGS. 2G-1 and 2G-2 are cross-sectional views of semiconductor devices 100b' and 100c' in accordance with some embodiments. Continued from FIG. 2F-1, as shown in FIG. 2G-1, a bottom metal layer 125 is formed on the second surface 103 which is opposite to the first surface 101 of the via structure 100b, and another electrical component 140 is formed on the lower surface of the bottom metal layer 125. In some embodiments, the electrical component 140 may include a single layer or multiple layers of conductive layers and a single layer or multiple layers of dielectric layers. In some embodiments, the via structure 100b is electrically connected to the electrical component 140 below by the bottom metal layer 125 and the via structure 100b is electrically connected to another electrical component 150 above by the top metal layer 130, so as to form the semiconductor device 100b'. It is worth noting that, the first conductive layer 120 and the second conductive layer 122 of the via structure 100b are electrically connected with each other merely by the top metal layer 130.

Continued from FIG. 2F-2, as shown in FIG. 2G-2, a bottom metal layer 125 is formed on the second surface 103 which is opposite to the first surface 101 of the via structure 100c, and another electrical component 140 is formed on the lower surface of the bottom metal layer 125. In some embodiments, the electrical component 140 may include a single layer or multiple layers of conductive layers and a single layer or multiple layers of dielectric layers. In some embodiments, the via structure 100c is electrically connected to the electrical component 140 below by the bottom metal layer 125 and the via structure 100c is electrically connected to another electrical component 150 above by the top metal layer 130, so as to form the semiconductor device 100c'. In this embodiment, the first conductive layer 120 and the second conductive layer 122 of the via structure 100c are electrically connected with each other by both of the bottom metal layer 125 and the top metal layer 130.

FIGS. 3A to 3F are cross-sectional views illustrating an exemplary sequential forming process of a via structure 100d in accordance with some embodiments. In comparison with the via structure 100a shown in FIG. 1G, the via structure 100d has more conductive layers, insulating layers and barrier layers. The via structure 100d is similar to the via structure 100b shown in FIG. 2F-1. The difference between the via structures 100b and 100d is that the first conductive layer 120 is in direct electrical contact with the second conductive layer 122 at the bottom of the hole 104 in the via structure 100d. In the via structure 100b, the first conductive layer 120 is not in direct electrical contact with the second conductive layer 122 at the bottom of the hole 104. Some processes and materials used to form the via structure 100d are similar to, or the same as, those used to form the via structures 100a, 100b and 100c and are not repeated herein.

Figure 3A:
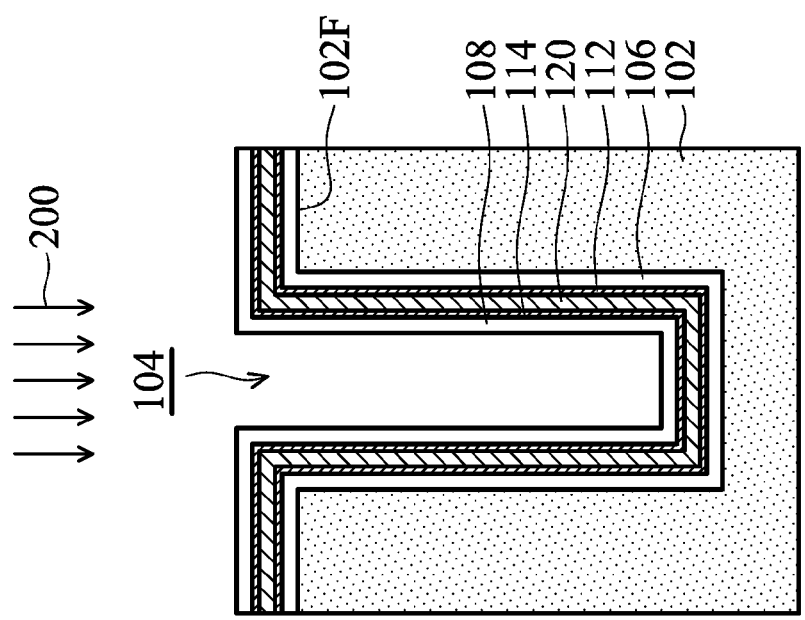
FIGS. 3A to 3F are cross-sectional views illustrating an exemplary sequential forming process of a via structure in accordance with some embodiments.

According to some embodiments, the formation of a hole 104 in FIG. 3A is similar to that of the hole 104 in FIG. 2A. A first insulating layer 106, a barrier layer 112, a first conductive layer 120, a barrier layer 114 and a second insulating layer 108 are formed sequentially on sidewall and bottom of the hole 104 and on the top surface 102F of the substrate 102.

Figure 3B:
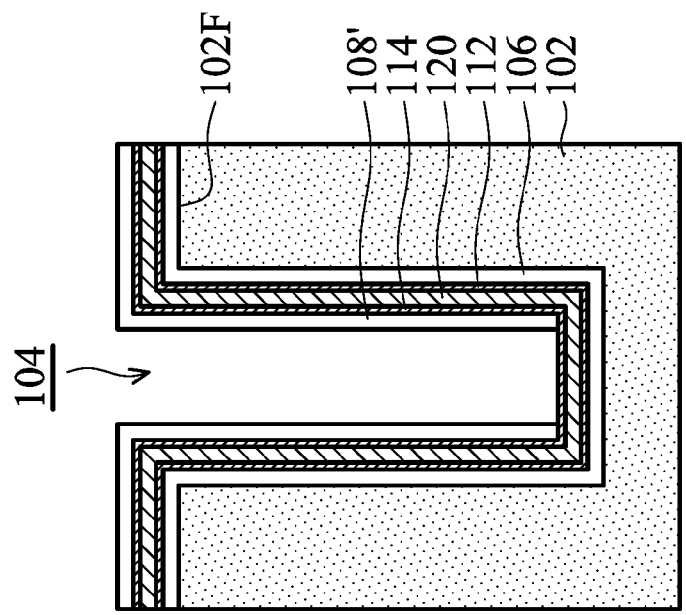

As shown in FIGS. 3A and 3B, an etching process 200 is performed on the second insulating layer 108 at the bottom of the hole 104 to remove a portion of the second insulating layer 108 at the bottom of the hole 104, so that an etched second insulating layer 108' is formed (as shown in FIG. 3B), in accordance with some embodiments. In some embodiments, the etching process 200 is performed by using a reactive ion etch (RIE) process.

Figure 3D:
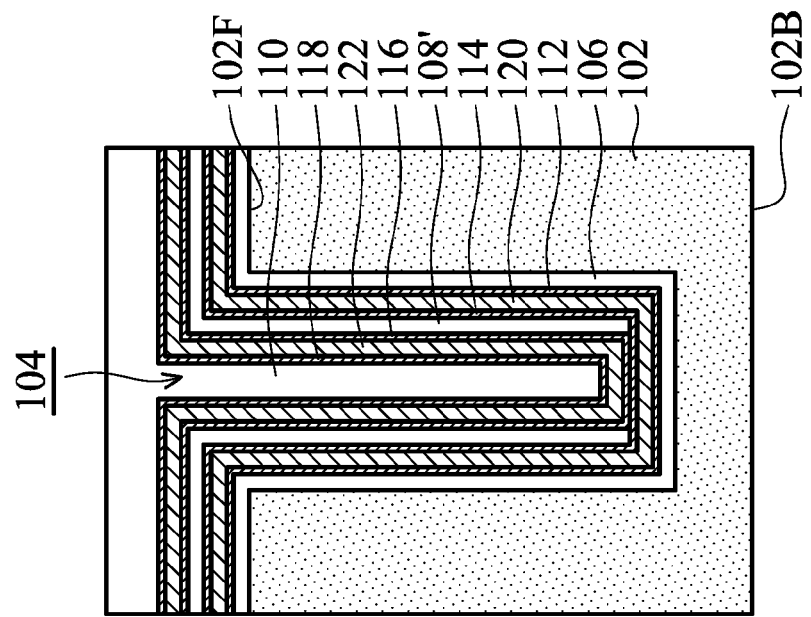
Figure 3C:
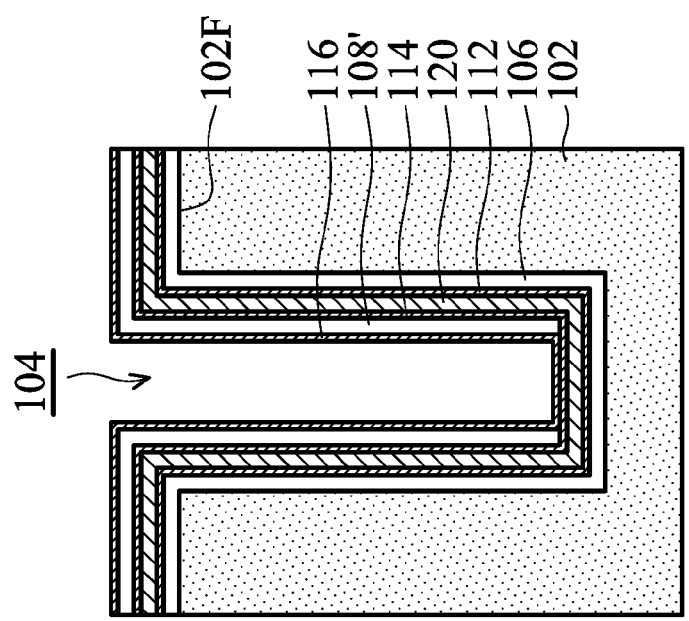

Next, as shown in FIGS. 3C and 3D, a barrier layer 116, a second conductive layer 122, a barrier layer 118 and a filling insulating layer 110 are formed sequentially on the top surface 102F of the substrate 102 and inside the hole 104. In addition, the second conductive layer 122, the barrier layer 118 and the filling insulating layer 110 are formed on the exposed barrier layer 114 and on the surface of the etched second insulating layer 108', in accordance with some embodiments.

Figure 3F:
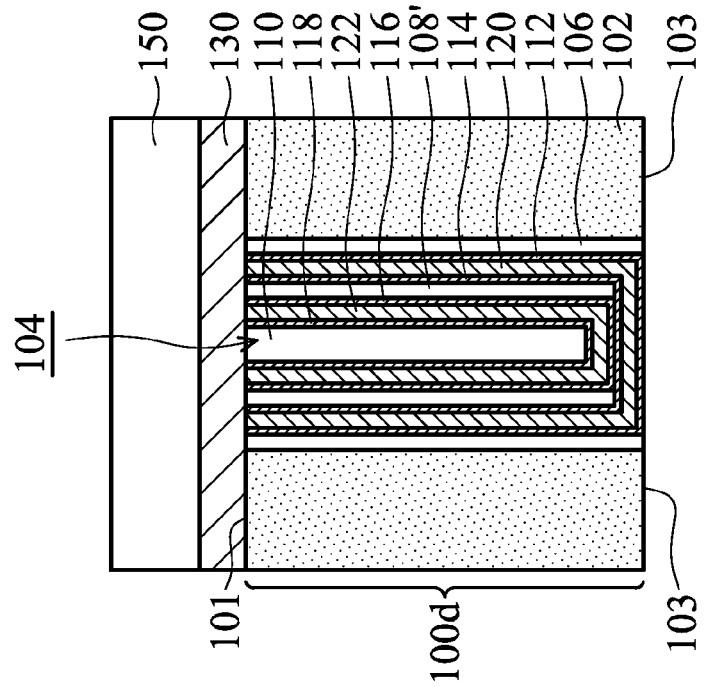
Figure 3E:
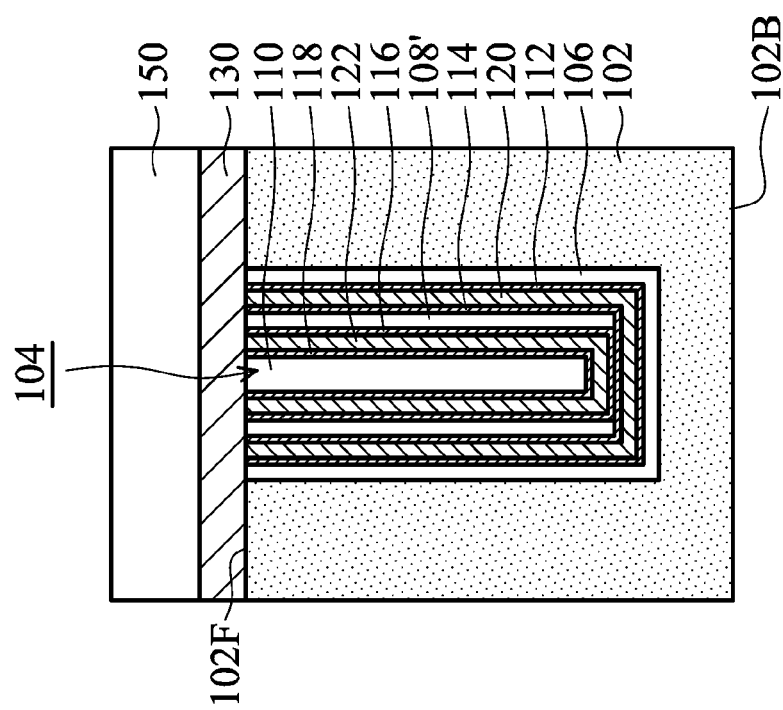

As shown in FIG. 3E, after forming the filling insulating layer 110, a planarization process is performed on the top surface 102F of the substrate 102 to remove the first insulating layer 106, the first conductive layer 120, the second insulating layer 108, the second conductive layer 122, the filling insulating layer 110 and the barrier layers 112, 114, 116 and 118 outside of the hole 104, so that the top surface 102F of the substrate 102 is exposed. Moreover, the first insulating layer 106, the first conductive layer 120, the second insulating layer 108, the second conductive layer 122, the filling insulating layer 110 and the barrier layers 112, 114, 116 and 118 inside of the hole 104 are leveled with the top surface 102F of the substrate 102, in accordance with some embodiments. Then, the top metal layer 130 is formed on the top surface 102F of the substrate 102, and the electrical component 150 is formed on the top metal layer 130. In some embodiments, the electrical component 150 may include a single layer or multiple layers of conductive layers and a single layer or multiple layers of dielectric layers.

As shown in FIGS. 3E and 3F, another planarization process (also called a bottom grinding process) is performed on the bottom surface 102B of the substrate 102 to remove a portion of the substrate 102 and a portion of the first insulating layer 106 located at the bottom of the hole 104, so that the barrier layer 112 is exposed (as shown in FIG. 3F) or the first conductive layer 120 is exposed (not shown), in accordance with some other embodiments. In addition, the top surface 102F of the substrate 102 is regarded as a first surface 101 of the via structure 100d, the bottom surface 102B of the substrate 102 is regarded as a second surface 103 of the via structure 100d, and the via structure 100d is formed from the portion between the first surface 101 and the second surface 103. In comparison with the via structure 100a, the via structure 100d is further includes a second conductive layer 122 disposed between the filling insulating layer 110 and the first conductive layer 120, and a portion of the second conductive layer 122 is located below the filling insulating layer 110. In comparison with the via structure 100a, the via structure 100d further includes a second insulating layer 108 disposed between the first conductive layer 120 and the second conductive layer 122, but does not include a portion of the second insulating layer 108 located below the second conductive layer 122. The difference between the via structures 100b and 100d is that the second insulating layer 108 is not disposed between the first conductive layer 120 and the second conductive layer 122 at the bottom of the hole 104 of the via structure 100d. Furthermore, in the via structure 100d, the bottom of the first conductive layer 120 adjoins the bottom of the second conductive layer 122, so that the first conductive layer 120 is electrically connected to the second conductive layer 122.

Figure 3G:
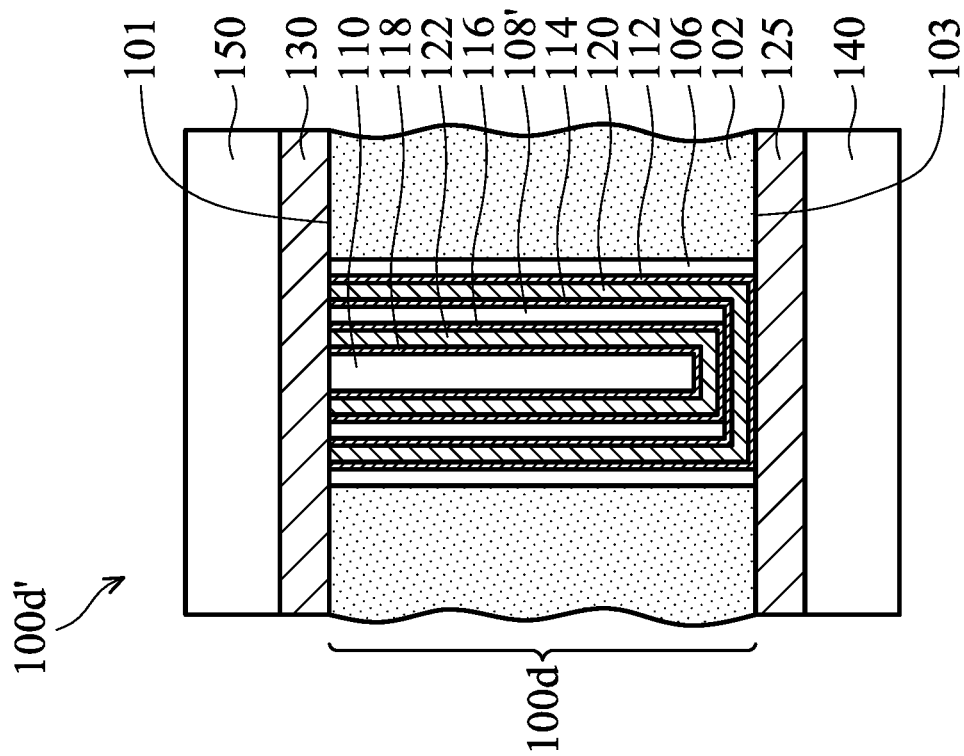
FIG. 3G is a cross-sectional view of a semiconductor device in accordance with some embodiments.

Then, as shown in FIG. 3G, the bottom metal layer 125 is formed on the second surface 103 which is opposite to the first surface 101 of the via structure 100d, and another electrical component 140 is formed on the lower surface of the bottom metal layer 125. In some embodiments, the via structure 100d is electrically connected to the electrical component 140 below by the bottom metal layer 125 and the via structure 100d is electrically connected to another electrical component 150 above by the top metal layer 130, so as to form the semiconductor device 100d'. It is worth noting that, in this embodiment, the bottom of the first conductive layer 120 adjoins the bottom of the second conductive layer 122, so that the first conductive layer 120 is electrically connected to the second conductive layer 122. In some embodiments, the barrier layer 114 contacts the barrier layer 116, and the barrier layers 114 and 116 are disposed between the first conductive layer 120 and the second conductive layer 122.

Both of the via structures 100b and 100d have two conductive layers 120 and 122, and both of the two conductive layers 120 and 122 include a portion disposed below the filling insulating layer 110, but the conductive paths of the via structures 100b and 100d still have differences. By comparison, the resistance of the via structure 100d is lower than the resistance of the via structure 100b, and the stress distribution in the via structure 100b is more uniform than that in the via structure 100d. In some embodiments, the stress distributions of the via structures including two more sets of insulating-conductive layers inside the hole 104, such as the via structures 100b, 100c and 100d are more uniform than the stress distribution of the via structure 100a.

Regarding the thickness of each layer inside the via structures in the embodiments of the disclosure, the thickness of the filling insulating layer for filling the hole is thicker than others, and the barrier layers are thinner than others since they are used to isolate the conductive layers and the insulating layers. Apart from this, the thicknesses of the first insulating layer 106, the second insulating layer 108, the first conductive layer 120 and the second conductive layer 122 are substantially equal, and the thicknesses of them may be adjusted based on the size of the hole 104. In some embodiments, the thicknesses of the first insulating layer 106, the second insulating layer 108, the first conductive layer 120 and the second conductive layer 122 are in a range from about 1 micron to about 10 microns.

The forming processes of the via structures of semiconductor devices provided in the disclosure are flexible. The via structures of the embodiments provided above may be formed in a front-end-of-line process or a back-end-of-line (BEOL) process of the entire semiconductor device's manufacturing process. The related conductive materials may be selected based on the forming process. The foregoing embodiments of the via structures meet the demand for low-resistance, and they can efficiently solve the problem of stress concentration which is caused by differences in mechanical properties and coefficients of thermal expansion between different filling materials in the via structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A via structure of a semiconductor device, comprising:
   a through hole penetrating from a first surface to an opposite second surface of a substrate;
   a filling insulating layer disposed in the through hole;
   a first conductive layer disposed in the through hole and surrounding the filling insulating layer, wherein a portion of the first conductive layer is located directly below the filling insulating layer and at a bottom of the through hole;
   a first insulating layer disposed on sidewalls of the through hole and surrounding the first conductive layer; and
   a second conductive layer sandwiched between the filling insulating layer and the first conductive layer, wherein a portion of the second conductive layer is located below the filling insulating layer and electrically connected to the first conductive layer.

2. The via structure of the semiconductor device as claimed in claim 1, further comprising:
   a second insulating layer sandwiched between the first conductive layer and the second conductive layer.

3. A semiconductor device, comprising:
   a through hole penetrating a substrate from a first surface to an opposite second surface;
   a filling insulating layer disposed in the through hole;
   a first conductive layer disposed in the through hole and surrounding the filling insulating layer, wherein a portion of the first conductive layer is located directly below the filling insulating layer and at a bottom of the through hole;
   a first insulating layer disposed on sidewalls of the through hole and surrounding the first conductive layer;
   a second conductive layer sandwiched between the filling insulating layer and the first conductive layer, wherein a portion of the second conductive layer is located below the filling insulating layer and electrically connected to the first conductive layer;
   a bottom metal layer adjoining the bottom of the through hole and electrically connected to an electrical component, wherein the portion of the first conductive layer located at the bottom of the through hole is electrically connected to the bottom metal layer; and
   a top metal layer adjoining a top of the through hole and electrically connected to another electrical component.

4. The semiconductor device as claimed in claim 3, further comprising:
   a second insulating layer sandwiched between the first conductive layer and the second conductive layer.

5. A method for forming a via structure of a semiconductor device, comprising:
   forming a hole in a substrate;
   forming a filling insulating layer in the hole;
   forming a first conductive layer in the hole and surrounding the filling insulating layer, wherein a portion of the first conductive layer is formed below the filling insulating layer and at a bottom of the hole;
   forming a first insulating layer in the hole and surrounding the first conductive layer;
   forming a second conductive layer in the hole and between the filling insulating layer and the first conductive layer, wherein a portion of the second conductive layer is formed below the filling insulating layer and electrically connected to the first conductive layer;

performing a planarization process on a top surface of the substrate to remove the filling insulating layer, the first conductive layer and the first insulating layer outside of the hole; and performing a bottom grinding process on a bottom surface of the substrate to remove a portion of the substrate and a portion of the first insulating layer located at the bottom of the hole.

6. The method as claimed in claim 5, wherein the bottom grinding process is performed until the first conductive layer is exposed.

7. The method as claimed in claim 5, wherein the bottom grinding process is performed until the second conductive layer is exposed.

8. The method as claimed in claim 5, further comprising:

forming a second insulating layer in the hole and between the first conductive layer and the second conductive layer; and after forming the second insulating layer, performing an etching process to remove a portion of the second insulating layer on the first conductive layer.

9. The via structure of the semiconductor device as claimed in claim 1, further comprising:

a plurality of first barrier layers disposed on the inside and outside of the first conductive layer respectively; and a plurality of second barrier layers disposed on the inside and outside of the second conductive layer respectively.

10. The semiconductor device as claimed in claim 3, further comprising:

a plurality of first barrier layers disposed on the inside and outside of the first conductive layer respectively; and a plurality of second barrier layers disposed on the inside and outside of the second conductive layer respectively.

* * * * *